United States Patent [19]

Sano et al.

[11] 3,765,888

[45] Oct. 16, 1973

[54] PHOTOSENSITIVE COMPOSITIONS AND A METHOD FOR RECORDING AND DIRECTLY DEVELOPING A COLOURED IMAGE

[75] Inventors: Reiji Sano; Susumu Yoshimura; Shirow Asakawa; Katsue Hasegawa, all of Osaka, Japan

[73] Assignee: Matsushita Electric Industrial Company, Limited, Osaka, Japan

[22] Filed: June 6, 1972

[21] Appl. No.: 286,540

Related U.S. Application Data

[63] Continuation-in-part of Ser. No. 73,266, Sept. 17, 1970, abandoned.

[52] U.S. Cl. .................. 96/27 R, 96/90 R, 96/91 N, 96/115 R, 96/115 P

[51] Int. Cl. ............................ G03c 1/70, G03c 1/58

[58] Field of Search .............. 96/90 R, 115 R, 27 R, 96/91 N, 115 P

[56] References Cited

UNITED STATES PATENTS 3,220,834 11/1965 Scribner ................................ 96/27

3,047,388 7/1962 Cairns .................................... 96/55

*Primary Examiner*—Ronald H. Smith

*Attorney*—Donal E. McCarthy et al.

[57] ABSTRACT

A method and a photo-sensitive composition for recording and directly developing a coloured image, including a photo-sensitive material A, a solvent B in which the material A is soluble and a third material C which forms a charge-transfer complex with the solvent B when the solvent is liberated from the material A. When the photo-sensitive composition applied on a substrate is exposed to an actinic light such as an ultraviolet ray, a cross-linking or polymerization reaction takes place in the material A which consequently is insolubilized in the solvent B. Accordingly, the solvent B is liberated from the photo-sensitive material A and forms a charge-transfer complex with the material C to develop a colour.

7 Claims, No Drawings

PHOTOSENSITIVE COMPOSITIONS AND A METHOD FOR RECORDING AND DIRECTLY DEVELOPING A COLOURED IMAGE

This is a continuation-in-part of application Ser. No. 73,266, filed Sept. 17, 1970 and now abandoned.

This invention relates to recording of a coloured image and, more particularly, to a photo-sensitive composition for recording of a coloured image and to a method for producing the coloured image.

A variety of photo-sensitive compositions have been proposed which are polymerizable or cross-linkable when exposed to actinic light. This invention is specifically directed to a photo-sensitive composition of this nature.

When a sheet coated with a mixture of a solvent-soluble low-molecular weight photo-sensitive material or a cross-linkable material, and a suitable polymerization initiator or a cross-linking agent is exposed to actinic light, there takes place polymerization or cross-linking in those portions of the photo-sensitive material which have been exposed to the light whereby the photo-sensitive material becomes a solvent-insoluble. If, therefore, an image is optically projected on a sheet coated with such photo-sensitive material, then the material is polymerized or cross-linked in accordance with the exposure to the light carrying a desired optical image. The given image is thus formed on the photo-sensitive sheet by rinsing the sheet with a suitable solvent so as to remove the portions of the photo-sensitive material which have not been fully exposed to the light. This method is now broadly utilized for fabricating the so-called photo-resists used as printing plates with excellent results.

Where it is desired to make use of the above described low-molecular weight photo-sensitive material on a sheet for use in photography or electro-duplication, difficulties are, however, encountered in that the sensitivity of the photo-sensitve material is out of the visible spectral range and that the absolute sensitivity of the material is low. Other disadvantages include the developing process of the wet type and the need of a colouring process.

An object of this invention is therefore to provide a method for recording and directly developing a coloured image without requiring subsequent developing and coloring processes.

Another object is to provide a photo-sensitive composition used for recording and directly developing a coloured image on a sheet of photographic or electroduplicating paper which is coated with the photo-sensitive composition.

The photo-sensitive composition operable in the method according to this invention comprises a photo-sensitive material A, a solvent B in which the material A is soluble, and a material C which can form a charge-transfer complex with the solvent B.

When, now, a photo-sensitive sheet coated with the composition defined above is exposed to actinic light, then the light-exposed portions of the photosensitive material A are photo-polymerized or cross-linked, so that the exposed portions become insoluble in the solvent B. Therefore, the molecules of the solvent B are liberated from the polymerized or cross-linked portions of the material A, and a colour appears on the exposed portions. This is due to the fact that the coexisting material C couples with the liberated molecules of the solvent B to produce a charge-transfer complex which usually has optical absorption within a visible range. This technique is remarkably advantageous in requiring no development step since the exposed image is directly formed without the necessary separate development step of the photographic type.

The photo-sensitive material A used in the present invention includes an azide polymer such as of paraazide benzoyl chloride-polyvinyl alcohol ester, polyvinylazide or the like, or polyvinylalcohol cinnamate. In this connection, the polyvinylazide can be prepared by reacting polyvinyl chloride with sodium azide in dimethylformamide and contains therein the following recurring units

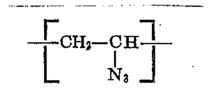

These compounds are readily cross-linked when exposed to actinic rays. Examples of the solvent B are xylene, ethylene glycol monomethyl ether, ethyl acetate, butyl acetate, dioxane, methyl ethyl ketone, cyclohexanone or the like. The colour developed varies depending upon the combination of the solvent B and the third material C such as tetracyanoquinodimethane, tetracyanoethylene, 2,3-dichloro-5, 6-dicyano-p-benzoquinone or the like: tetracyanoethylene is preferred to be used in combination with xylene, ethylene glycol monomethyl ether, ethyl acetate, butyl acetate and methyl ethyl ketone; tetracyanoquinodimethane with xylene and cyclohexanone; and 2,3-dichloro-5, 6-dicyano-p-benzoquinone with xylene. This will hereinafter be described in detail in Examples.

A preferred method for recording and directly developing a coloured image on a sheet coated with a photo-sensitive composition in accordance with the invention is described. The colour image is formed by: mixing a photo-sensitive material which is polymerizable or cross-linkable when exposed to actinic light, a solvent in which the material is soluble, the material becoming insoluble when the material is polymerized or cross-linked, and a third material selected from the group consisting of tetracyanoethylene, tetracyanoquinodimethane and 2,3-dichloro-5, 6-dicyano-p-benzoquinone which forms a charge-transfer complex with the solvent when the solvent is liberated from the photo-sensitive material polymerized or cross-linked; applying the resultant mixture onto a sheet; exposing said sheet through an image to an actinic light; and drying the sheet, whereby the coloured image appears on areas exposed.

The following Examples illustrate the invention.

EXAMPLE 1

Two g of para-azide benzoyl chloride-polyvinyl alcohol ester were used as the photo-sensitive material A. 5 grams of xylene and 200 milli-grams of tetracyanoethylene (TCNE) were used as the solvent B and the material C, respectively. The mixture of A, B and C was applied on the surface of a transparent sheet. Xylene acted as a solvent for the azide polymer. The resultant mixture was transparent.

When the mixture on the transparent sheet was exposed to an ultraviolet ray from a xenon arc lamp, the exposed portions of the azide polymer were highly cross-linked and became insoluble in xylene. Colouring in red was observed in the exposed portions of the originally transparent sheet.

EXAMPLE 2

Example 1 was repeated except that ethylene glycol monomethyl ether, ethyl acetate, butyl acetate and dioxane each was used as solvent B. The following colours were developed, on the exposed portions of the respective sheets, depending upon the kinds of the solvents used:

| | |
|---|---|
| Ethylene glycol monomethyl ether | Brown |
| Methyl acetate | Orange |
| Butyl acetate | Yellow |
| Dioxane | Yellowish green |

EXAMPLE 3

Two g of para-azide benzoyl alcohol ester and 200mg of tetracyanoquinodimethane were used as photo-sensitive material A and third material C, respectively. Xylene and cyclohexanone each in 5g was used as solvent B. Two kinds of solutions using different solvents were prepared by mixing the above components, and were separately applied onto transparent sheets. The resultants sheets were exposed to ultraviolet ray and dried. The following colours were developed on the exposed portions of the sheets.

| | |
|---|---|
| Xylene | Reddish brown |
| Cyclohexanone | Green |

EXAMPLE 4

Example 1 was repeated except that polyvinyl alcohol cynnamate ester was used as material A and methyl ethyl ketone was used as the solvent B. A yellowish colour was developed on the exposed portions of the transparent sheet.

EXAMPLE 5

Example 1 was repeated except that xylene was used as solvent B and 2,3-dichloro-5,6-dicyano-p-benzoquinone as third material C.

A reddish brown appeared on the exposed portions of the transparent sheet. Furthermore, when polyvinyl azide was used instead of the para-azide benzoyl chloride polyvinyl alcohol ester as photo-sensitive material A, a similar result was obtained.

What is claimed is:

1. A photo-sensitive composition comprising a photosensitive material of the type which is polmerizable or cross-linkable when exposed to an actinic light, a solvent in which said material is soluble, said material becoming insoluble and liberating said solvent when said material is polymerized or cross-linked, and a third material which forms a charge-transfer complex with said solvent when said solvent is liberated from said photo-sensitive material.

2. A photo-sensitive composition as claimed in claim 1, wherein said photo-sensitive material is selected from the group consisting of para-azide benzoyl chloride polyvinyl alcohol ester, polyvinylazide, and polyvinyl alcohol cinnamate.

3. A photo-sensitive composition as claimed in claim 1, wherein said third material is selected from the group consisting of tetracyanoethylene, tetracyanoquinodimethane and 2,3-dichloro-5,6-dicyano-p-benzoquinone.

4. A photo-senstive composition as claimed in claim 1, wherein said solvent is selected from the group consisting of xylene, ethylene glycol monomethyl ether, ethyl acetate, butyl acetate, dioxane and methyl ethyl ketone, and said third material is tetracyano-ethylene.

5. A photo-sensitive composition as claimed in claim 1, wherein said solvent is selected from the group consisting of xylene and cyclohexanone, and said third material is tetracyanoquinodimethane.

6. A photo-sensitive composition as claimed in claim 1, wherein said solvent is xylene and said third material is 2,3-dichloro-5,6-dicyano-p-benzoquinone.

7. A method for recording and directly developing a coloured image on a sheet coated with a photo-sensitive composition, which comprises the steps of: mixing a photo-sensitive material which is polymerizable or cross-linkable when exposed to an actinic light, a solvent in which said photo-sensitive material is soluble, said material becoming insoluble when said material is polymerized or cross-linked, and a third material which forms a charge-transfer complex with said solvent when said solvent is liberated from said photo-sensitive material polymerized or cross-linked; applying the resultant mixture onto a sheet; exposing said sheet through an image to an actinic light; and drying said sheet, whereby the coloured image appears on areas exposed.

* * * * *